United States Patent [19]
Fassel et al.

[11] Patent Number: 6,094,349
[45] Date of Patent: Jul. 25, 2000

[54] ELECTRICAL DEVICE HAVING A PRINTED-CIRCUIT BOARD AND METHOD FOR ASSEMBLING THE DEVICE

[75] Inventors: Reinhard Fassel, Oberasbach; Hartmut Zoebl, Fuerth, both of Germany

[73] Assignee: Robert Bosch GmbH, Stuttgart, Germany

[21] Appl. No.: 09/128,174

[22] Filed: Aug. 3, 1998

[30] Foreign Application Priority Data

Aug. 7, 1997 [DE] Germany ............................ 197 34 110

[51] Int. Cl.[7] ........................................................ H05K 7/20
[52] U.S. Cl. ..................... 361/704; 361/699; 361/728; 361/736; 361/737; 361/765; 257/679; 257/687; 257/712; 455/325; 174/52.1; 165/80.2
[58] Field of Search ................................ 361/699, 704, 361/726, 728, 736, 737, 765; 257/687, 679, 712; 455/59, 325; 174/52.1, 52.4, 35 MS, 35 R; 165/80.2, 80.3

[56] References Cited

U.S. PATENT DOCUMENTS 5,020,149  5/1991  Hemmie .................................. 455/325
5,541,448  7/1996  Carpenter ............................... 257/679
5,694,037  12/1997  Borschert et al. ..................... 192/84.1

FOREIGN PATENT DOCUMENTS 44 33 826  3/1996  Germany .

*Primary Examiner*—Leo P. Picard
*Assistant Examiner*—Michael Datskovsky
*Attorney, Agent, or Firm*—Kenyon & Kenyon

[57] ABSTRACT

An electrical device has a printed-circuit board secured to a cover of the electrical-device housing, as well as a heat-dissipation mat arranged on a housing wall. The cover secured to the housing, as well as guideways of the housing, in which guideways the printed-circuit board is received, exert a tension force on the printed-circuit board, because of which electronic components arranged on the printed-circuit board, under conditions of intimate contact with the heat-dissipation mat, are embedded into the heat-dissipation mat. This is achieved by introducing the printed-circuit board in inclined position into the housing and, shortly before it reaches its final position, swivelling the printed-circuit board toward the wall of the housing having the heat-dissipation mat.

5 Claims, 1 Drawing Sheet

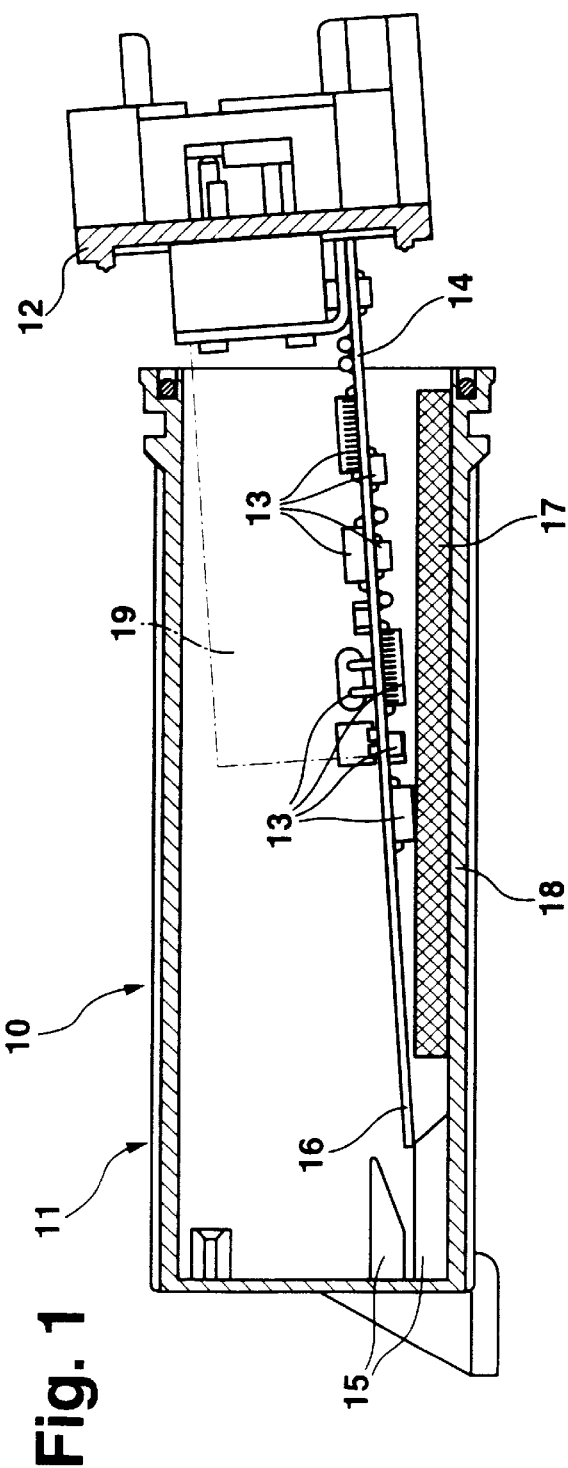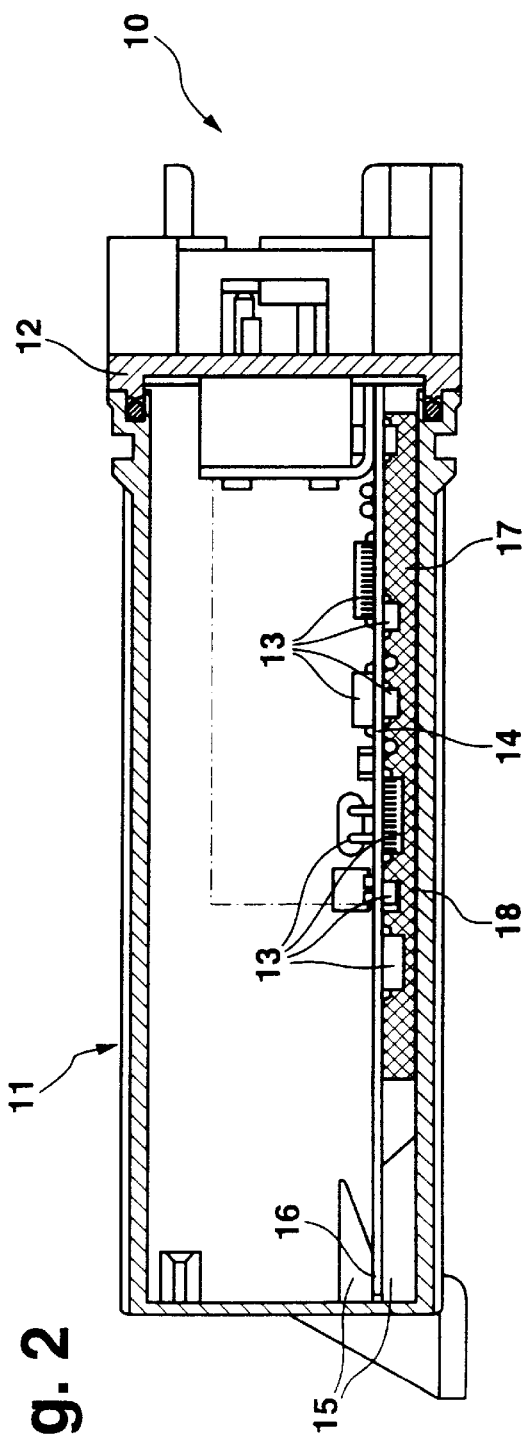

ELECTRICAL DEVICE HAVING A PRINTED-CIRCUIT BOARD AND METHOD FOR ASSEMBLING THE DEVICE

FIELD OF THE INVENTION

The present invention relates to an electrical device including a printed-circuit board and a method for assembling the electrical device.

BACKGROUND INFORMATION

A conventional electrical device, in which the heat generated by electronic components of a printed-circuit board is dissipated to a surrounding air in a device housing and walls of the device housing, is known in the art. With a miniaturization of the electronic components and a greater arrangement density on the printed-circuit board, the heat dissipation is increasingly causing difficulties. The heat sinks on the printed-circuit board take up insertable area and installation space in the housing and are, therefore, disadvantageous.

German Patent No. 44 33 826 describes a conventional device which brings electronic components in contact with a heat-conductor foil which bridges a space in the device between the electronic components and an outer housing wall. The heat-conductor foil is self-adhesive on both sides and bonded both to the electronic components and the housing wall. However, stresses between the printed-circuit board and the housing can cause detachment of the heat-conductor foil and impair the heat transfer to the housing wall.

SUMMARY OF THE INVENTION

An electrical device according to the present invention has an advantage that, by using an elastic flexible heat-dissipation mat, an intimate, large-surface contact to electronic components, a printed-circuit board and a housing wall, which promotes a heat dissipation to the housing that is usually made of metal, is attained. In addition, the elastic heat-dissipation mat is not only able to cling to the electronic components, it also compensates for tolerances between the printed-circuit board and the housing wall, given suitable pressure. Functioning of the heat-dissipation mat is therefore durably retained.

A method according to the present invention for assembling the device is advantageous since it considerably facilitates an assembly operation. In particular, a contact between the electronic components and the heat-dissipation mat first takes place toward an end of an insertion of the printed-circuit board into the housing, which largely eliminates a mechanical sticking of the electronic components to the heat-dissipation mat and its damage.

A further advantage of the present invention is that the heat-dissipation mat is expediently joined to the printed-circuit board or the housing. This joinder secures a position of the heat-dissipation mat before and during a placement of the printed-circuit board into the housing. Moreover, a removal of the printed-circuit board from the electrical device is possible without difficulty.

BRIEF DESCRIPTION OF THE DRAWINGS

FIG. 1 shows a section through a housing of an electrical device into which a printed-circuit board is being inserted.

FIG. 2 shows the section illustrated in FIG. 1 with the printed-circuit board in an installed state.

DETAILED DESCRIPTION OF THE INVENTION

FIGS. 1 and 2 show an electrical device 10 that includes a housing 11 having an opening on a front side which is closable by a cover 12. The housing 11 may have, for example, a rectangular shape. A printed-circuit board 14 is situating electronic components 13 and is coupled to the cover 12. The housing 11 at a blind end includes guideways 15 that are formed by projections arranged in pairs, and in which are accommodated the printed-circuit board 14 having a cover-remote end section 16 remote from the cover 12.

A heat-dissipation mat 17 is also situated in the housing 11. The heat-dissipation mat 17 is coupled by an adhesive agent to a housing wall 18 which extends approximately parallel to the printed-circuit board 14 inserted into the housing 11. The heat-dissipation mat 17 has a high thermal conductivity and it is electrically insulating and elastically flexible.

When assembling the electrical device 10, the printed-circuit board 14 is inserted in an inclined position into the housing 11, as shown in FIG. 1. In an alternative exemplary embodiment, the inclined position can possibly be restricted by an electrical subassembly 19 being coupled to the cover 12. Shortly before reaching a final position, the printed-circuit board 14 is inserted with the end section 16 into the guideways 15. Shortly before, or upon reaching the final position, the printed-circuit board 14 is swivelled toward the housing wall 18, so that the printed-circuit board 14, the heat-dissipation mat 17 and the housing wall 18 come in contact, and the electronic components 13 arranged on a bottom side of the printed-circuit board 14 contact the heat-dissipation mat 17 and are embedded into it, as shown in FIG. 2.

At the same time, the cover 12, which in the final position is firmly coupled to the housing 11, and the guideways 15 exert a tensional force on the printed-circuit board 14 in a direction towards the housing wall 18. This tensional force ensures that the contact of the electronic components 13 to the heat-dissipation mat 17 is very intensive and long-lasting. A result of the tensional force is also that a non-parallelism between the printed-circuit board 14 and the housing wall 18 as comes about, for example, due to slants in the shaping of injection-molded housing 11, are compensated for by the elasticity of the heat-dissipation mat 17. At the conclusion of the assembly operation, the cover 12 is securely joined to the housing 11.

During operation of the electrical device 10, the heat developing at the electronic components 13 is transferred from the heat-dissipation mat 17 to the housing wall 18, preferably made of aluminum, and from the housing wall 18 the heat is dissipated to an ambient air.

In an alternative exemplary embodiment according to the present invention, the heat-dissipation mat 17 can be integrally joined to the printed-circuit board 14 instead of to the housing wall 18. In this case, before introducing the printed-circuit board 14 into the housing 11, the heat-dissipation mat 17 is secured to the printed-circuit board 14 by an adhesive agent. Preferably, the adhesive agent is applied as a coating on the heat-dissipation mat 17.

Area-wise, the heat-dissipation mat 17 can join nearly the entire printed-circuit board 14 to the housing wall 18. However, the heat-dissipation mat 17 can also only sectionally fill up a space between the printed-circuit board 14 and the wall 18 of the housing 11.

What is claimed is:

1. An electrical device comprising:
    a housing unit having a wall, an opening on a front side, and guide ways on the opposite side;
    a cover firmly coupled to said housing unit for closing said opening;

a printed circuit board supporting electronic components and including a cover-remote and section at a first end of said printed circuit board, said cover being secured to a second end of said printed circuit board, said second end being opposite to said first end, said cover-remote end section of said printed circuit board being accommodated in said guide ways, said printed circuit board being substantially parallel to said wall; and an elastic heat-dissipation mat situated between said printed circuit board and said wall, wherein said cover and said guide ways apply a tension force on said printed circuit board, causing said electronic components to embed at least partially into said heat-dissipation mat.

2. The electrical device according to claim 1, wherein said heat-dissipation mat is integrally coupled to one of said well and said printed circuit board.

3. The electrical device according to claim 2, wherein said heat-dissipation mat is coated with an adhesive agent.

4. A method for assembling an electrical device including a housing unit, a cover firmly coupled to the housing unit for closing an opening on a front side of the housing unit, a printed circuit board supporting electronic components and including a cover-remote end section at a first and of the printed circuit board, and an elastic heat-dissipation mat situated between the printed circuit board and a wall of the housing unit, the cover being secured to a second and of the printed circuit board, the second end being opposite to the first end, the method comprising the steps of:

inserting the printed circuit board into the housing unit in an inclined manner;

engaging the cover-remote end section of the printed circuit board with guide ways of the housing unit; and before the printed circuit board reaches a final position, swivelling the printed circuit board toward the wall to position the printed circuit board substantially parallel to the wall and to at least partially embed the electronic components into the heat-dissipation mat.

5. The method according to claim 4, further comprising the step of:

before inserting the printed circuit board into the housing unit, coupling the heat-dissipation mat to one of the printed-circuit board and the wall.

* * * * *

UNITED STATES PATENT AND TRADEMARK OFFICE
CERTIFICATE OF CORRECTION

PATENT NO.     : 6,094,349
DATED          : July 25, 2000
INVENTOR(S)    : Reinhard Fassel and Hartmut Zoebl It is certified that error appears in the above-identified patent and that said Letters Patent is hereby corrected as shown below:

Column 3,
Line 2, change "… AND…" to -- … END… --.

Column 4,
Lines 1 and 4, change "… AND…" to -- … END… --.

Signed and Sealed this

Twelfth Day of October, 2004

JON W. DUDAS
*Director of the United States Patent and Trademark Office*